United States Patent
Ueda et al.

(10) Patent No.: US 7,411,232 B2
(45) Date of Patent: Aug. 12, 2008

(54) SEMICONDUCTOR PHOTODETECTING DEVICE AND METHOD OF MANUFACTURING THE SAME

(75) Inventors: Tetsuzo Ueda, Toyonaka (JP); Seiichiro Tamai, Toyono-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/180,581

(22) Filed: Jul. 14, 2005

(65) Prior Publication Data

US 2006/0011954 A1    Jan. 19, 2006

(30) Foreign Application Priority Data

Jul. 16, 2004    (JP)    ............... 2004-209676

(51) Int. Cl.
  *H01L 31/113*    (2006.01)
(52) U.S. Cl. .................. 257/291; 257/294; 257/435; 257/440; 257/461; 257/E31.121; 257/E31.123; 257/E31.092
(58) Field of Classification Search .......... 257/291, 257/294, 435, 440, 461, 31.092, 31.121, 257/31.123
  See application file for complete search history.

(56) References Cited

U.S. PATENT DOCUMENTS

| | | | | | |
|---|---|---|---|---|---|
| 4,332,974 | A | * | 6/1982 | Fraas | ............ 136/249 |
| 4,377,723 | A | * | 3/1983 | Dalal | ............ 136/249 |
| 4,654,685 | A | * | 3/1987 | Yamada | ............ 257/184 |
| 6,239,453 | B1 | | 5/2001 | Yamada et al. | |
| 6,730,934 | B2 | | 5/2004 | Yamada et al. | |
| 6,838,743 | B2 | | 1/2005 | Yamada et al. | |
| 6,841,816 | B2 | * | 1/2005 | Merrill et al. | ............ 257/294 |
| 6,982,443 | B2 | * | 1/2006 | Hsu et al. | ............ 257/226 |
| 2003/0160251 | A1 | * | 8/2003 | Wanlass et al. | ............ 257/80 |
| 2007/0105250 | A1 | * | 5/2007 | Daniels et al. | ............ 438/22 |

FOREIGN PATENT DOCUMENTS

JP    59-18196    1/1984

(Continued)

*Primary Examiner*—Matthew E. Warren
(74) *Attorney, Agent, or Firm*—Wenderoth, Lind & Ponack, L.L.P.

(57) ABSTRACT

A semiconductor photodetecting device is provided for enabling a solid-state image sensor to meet the requirements of higher quality imaging and more reduction in cost. The photodetecting device of the present invention includes: a semiconductor substrate; and an epitaxial layer formed on the semiconductor substrate by epitaxial growth. The epitaxial layer has a multilayer structure including: a first pn junction layer; a first insulating layer; a second pn junction layer; a second insulating layer; and a third pn junction layer. The first insulating layer and the second insulating layer have openings, and the first pn junction layer and the second pn junction layer are adjacent to each other through the openings of the first insulating layer which is placed in between these pn junction layers, and the second pn junction layer and the third pn junction layer are adjacent to each other through the openings of the second insulating layer which is placed in between these pn junction layers. Each of the insulating layers has a periodic structure of refractive indices in the stacking direction as well as a periodic structure of similar-shaped openings which are concentric in the in-plane direction, and therefore has filtering and light condensing functions for the pn junction layer which is formed beneath the insulating layer.

11 Claims, 7 Drawing Sheets

FOREIGN PATENT DOCUMENTS

| | | |
|---|---|---|
| JP | 59-94412 | 5/1984 |
| JP | 62-52954 | 4/1987 |
| JP | 63-239979 | 10/1988 |
| JP | 63-300574 | 12/1988 |
| JP | 1-134966 | 5/1989 |
| JP | 1-149488 | 6/1989 |
| JP | 5-55622 | 3/1993 |
| JP | 5-183139 | 7/1993 |
| JP | 6-53537 | 2/1994 |
| JP | 6-120554 | 4/1994 |
| JP | 10-160574 | 6/1998 |
| JP | 2000-188424 | 7/2000 |
| JP | 2002-502120 | 1/2002 |
| JP | 2002-134764 | 5/2002 |
| JP | 2003-502847 | 1/2003 |
| JP | 2003-332551 | 11/2003 |
| WO | WO99/39372 | 8/1999 |
| WO | WO 00/77861 | 12/2000 |

* cited by examiner

PRIOR ART FIG. 2

| R | G | R | G |
|---|---|---|---|
| G | B | G | B |
| R | G | R | G |
| G | B | G | B |
| R | G | R | G |

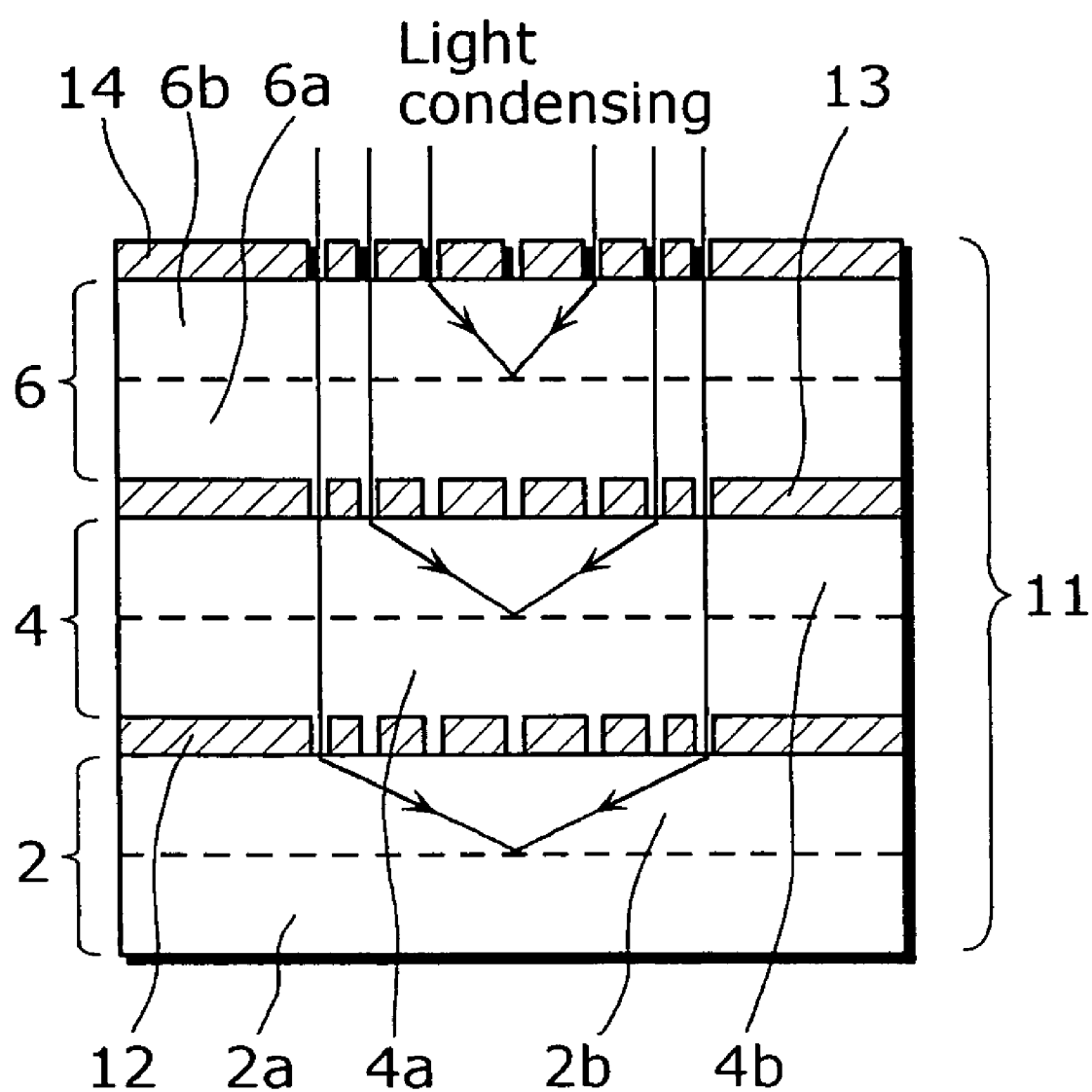

SEMICONDUCTOR PHOTODETECTING DEVICE AND METHOD OF MANUFACTURING THE SAME

BACKGROUND OF THE INVENTION

1. Field of the Invention

The present invention relates to a semiconductor photodetecting device and a method of manufacturing it, and more particularly to a semiconductor photodetecting device for a charge-coupled device (CCD) or a complementary metal-oxide-semiconductor (CMOS) solid-state image sensor and a method of manufacturing it.

2. Description of the Related Art

CCD or MOS solid-state image sensors are mounted on digital still cameras, camcorders and the like. Such solid-state image sensors convert light incident on their semiconductor photodetecting devices which are made of semiconductor materials into electric charges. In the CCD solid-state image sensor, the generated signal charges are accumulated in potential wells, and then transferred. In the MOS solid-state image sensor, on the other hand, the generated signal charges are read out as voltage directly from the semiconductor photodetecting devices using MOS transistors. Imaging areas in those solid-state image sensors, in which the semiconductor photodetecting devices are two-dimensionally arranged, have red-green-blue (RGB) primary color filters with the Bayer or stripe type color array for colorization (for example, refer to Japanese Laid-Open Patent Application No. 05-183139 publication).

FIG. 1 is a schematic cross-sectional view showing a structure of a semiconductor photodetecting device in a conventional MOS solid-state image sensor and its periphery.

The conventional solid-state image sensor is comprised of: a plurality of semiconductor photodetecting devices 21 which are a plurality of n-type regions formed in a p-type silicon substrate 20; a color filter 22 which is placed at a light incident side of the semiconductor photodetecting devices 21; and a plurality of output amplifiers 23, which have each MOS transistor 24 so as to be connected with each semiconductor photodetecting device 21, and which convert signal charges into voltage, amplify the voltage, and output it.

It should be noted that RGB primary colors in the color filter 22 are arranged in the Bayer color array pattern as shown in FIG. 2.

SUMMARY OF THE INVENTION

In recent years, it has been required to provide a solid-state image sensor with higher performance, higher quality imaging, more reduction in cost and size, and the like.

However, the conventional solid-state image sensor selects, through the color filter, red, green and blue light from incident light. The semiconductor photodetecting devices which convert the selected red, green and blue light into electric charges are arranged on the same plane. This results in a problem that when it comes to a smaller chip, the conventional solid-state image sensor has smaller photosensing areas corresponding to respective color pixels and eventually reduces photosensitivity and thus reduces color reproducibility of images, so that the conventional solid-state image sensor fails to meet the requirement of higher quality imaging or more reduction in cost.

In view of the foregoing, it is an object of the present invention to provide a semiconductor photodetecting device that solves the above problem and thus enables a solid-state image sensor to meet the requirements of higher quality imaging and more reduction in cost.

In order to achieve the above object, the semiconductor photodetecting device according to the present invention is a device which converts incident light into electric charges, the device including: stacked pn junction layers; and a pn junction isolating layer formed between the pn junction layers which are adjacent to each other, wherein the pn junction isolating layer has openings, and the pn junction layers are adjacent to each other through the openings.

Here, a pn junction in the first pn junction layer may be positioned to have highest photodetecting sensitivity to red light, a pn junction in the second pn junction layer may be positioned to have highest photodetecting sensitivity to green light, and a pn junction in the third pn junction layer may be positioned to have highest photodetecting sensitivity to blue light. The pn junction isolating layer may be made of a material including oxygen. Or, the pn junction isolating layer may be made of one of silicon dioxide and silicon nitride. Each of the pn junction layers may be made of a semiconductor material including silicon. Or, at least one of the pn junction layers may be made of one of the following: amorphous silicon, microcrystalline silicon, single crystal silicon carbide, amorphous silicon carbide and microcrystalline silicon carbide.

As described above, the present invention provides the semiconductor photodetecting device having at least three stacked pn junction layers as photodiodes for converting red, green and blue light respectively into electric charges. Therefore, all of red, green and blue light components of the incident light can be used in a single semiconductor photodetecting device, which can result in an increase in efficiency of available light in the semiconductor photodetecting device and improvement in color reproducibility of images in the solid-state image sensor. Accordingly, the semiconductor photodetecting device according to the present invention enables the solid-state image sensor to meet the requirement of still higher quality imaging.

The semiconductor photodetecting device according to the present invention can perform RGB primary color sensing in the same location so that it enables the solid-state image sensor to achieve higher resolution of images.

The semiconductor photodetecting device according to the present invention enables the solid-state image sensor to do without using a color filter for color separation and without using (placing on the same plane) multiple kinds of semiconductor photodetecting devices for converting red, green, and blue light respectively into electric charges, and therefore enables the solid-state image sensor to meet the requirement of further reduction in size and cost.

Furthermore, in the semiconductor photodetecting device according to the present invention, a pn junction layer is formed by regrowing itself on another lower pn junction layer through the openings of the semiconductor layer which is placed in between these two pn junction layers so that they are adjacent to each other, which results in poor crystallinity of the pn junction layers and therefore achievement of high sensitivity of the semiconductor photodetecting device.

In addition, in the semiconductor photodetecting device according to the present invention, pn junction layers can be formed without any constraints of the semiconductor layer as a substrate to the crystallinity of the pn junction layers or the like, so that semiconductor materials can be selected with high flexibility, that is, the semiconductor photodetecting device according to the present invention can enhance design flexibility.

The pn junction isolating layer may be made of a material having a refractive index different from refractive indices of the adjacent pn junction layers, and have a light condensing function. The openings may have similar shapes which are concentric on a plane of the pn junction isolating layer, and the pn junction isolating layer may be formed so that light that passes through the pn junction isolating layer is brought into focus at a pn junction in the pn junction layer placed below the pn junction isolating layer.

Accordingly, the semiconductor layer functions as a lens so as to efficiently condense incident light in the pn junction layer, which results in improvement in photosensing efficiency of the pn junction layer and therefore achievement of high photosensitivity of the semiconductor photodetecting device.

The pn junction isolating layer may include an insulating layer.

Accordingly, an arrangement of p-type regions and n-type regions in each pn junction layer is free of influence from another arrangement in another pn junction layer, which results in high design flexibility in the semiconductor photodetecting device.

The semiconductor photodetecting device according to the present invention includes: a first pn junction layer; a second pn junction layer placed above the first pn junction layer; and a third pn junction layer placed above the second pn junction layer, and a band gap of the first pn junction layer may be smaller than a band gap of the second pn junction layer, and the band gap of the second pn junction layer may be smaller than a band gap of the third pn junction layer. Alternatively, the band gap of the first pn junction layer may be smaller than energy corresponding to a red light wavelength, the band gap of the second pn junction layer may be smaller than energy corresponding to a green light wavelength, and the band gap of the third pn junction layer may be smaller than energy corresponding to a blue light wavelength.

Accordingly, it becomes possible to design the first pn junction layer so as to have the absorption peak in the red light wavelength region, the second pn junction layer so as to have the absorption peak in the green light wavelength region, and the third pn junction layer so as to have the absorption peak in the green light wavelength region. As a result, the semiconductor photodetecting device according to the present invention enables the solid-state image sensor to improve color reproducibility of images.

The pn junction isolating layer may selectively allow light having a predetermined wavelength to pass through said pn junction isolating layer. The pn junction isolating layer may be made up of at least two stacked layers having different refractive indices.

Accordingly, it becomes possible to completely prevent light leakage into another pn junction layer, and thus achieve sharper color separation. Therefore, the semiconductor photodetecting device according to the present invention enables the solid-state image sensor to improve color image sharpness.

The present invention can be embodied as a method of manufacturing a semiconductor photodetecting device, the method including: forming a first pn junction layer on a substrate; forming a first pn junction isolating layer on the first pn junction layer; forming openings in the first pn junction isolating layer; and forming a second pn junction layer on the first pn junction isolating layer.

Here, the first pn-junction layer may be formed by positioning a pn junction in the first pn junction layer to have highest photodetecting sensitivity to red light, the second pn junction layer may be formed by positioning a pn junction in the second pn junction layer to have highest photodetecting sensitivity to green light, and the third pn junction layer may be formed by positioning a pn junction in the third pn junction layer to have highest photodetecting sensitivity to blue light.

Accordingly, the present invention achieves the method of manufacturing the semiconductor photodetecting device that enables the solid-state image sensor to meet the requirement of the desired higher quality imaging. The present invention also achieves the method of manufacturing the semiconductor photodetecting device that enables the solid-state image sensor to achieve high resolution of images. The present invention further achieves the method of manufacturing the semiconductor photodetecting device that enables the solid-state image sensor to meet the requirement of more reduction in size. The present invention still further achieves the method of manufacturing the semiconductor photodetecting device with more design flexibility.

The first and second pn junction layers may be formed by epitaxial growth, and the third pn junction layer may be formed by epitaxial growth.

Accordingly, it becomes possible to manufacture the semiconductor photodetecting device easily. Therefore, the present invention achieves the method of manufacturing the semiconductor photodetecting device that curbs rising costs caused by low yields. The present invention also achieves the method of manufacturing the semiconductor photodetecting device with high crystallinity.

The openings may be formed so as to have similar shapes which are concentric on a plane of the first pn junction isolating layer.

Accordingly, the present invention achieves the method of manufacturing the semiconductor photodetecting device with high sensitivity.

The method of manufacturing the semiconductor photodetecting device according to the present invention may include: forming a second pn junction isolating layer on the second pn junction layer; forming openings in the second pn junction isolating layer; and forming a third pn junction layer on the second pn junction isolating layer, wherein the forming of the first, second and third pn junction layers includes forming the first, second and third pn junction layers having different band gaps from one another.

Accordingly, the present invention achieves the method of manufacturing the semiconductor photodetecting device that enables the solid-state image sensor to improve color reproducibility of images. Furthermore, the first and second pn junction isolating layers may be insulating layers.

Accordingly, the present invention achieves the method of manufacturing the semiconductor photodetecting device with high design flexibility.

As described above, the present invention achieves the semiconductor photodetecting device that enables the solid-state image sensor to meet the requirements of the desired higher quality imaging and more reduction in cost, and the method of manufacturing such device. The present invention also achieves the semiconductor photodetecting device with high sensitivity and the method of manufacturing such device. The present invention also achieves the semiconductor photodetecting device that enables the solid-state image sensor to achieve high resolution of images, and the method of manufacturing such device. The present invention further achieves the semiconductor photodetecting device that enables the solid-state image sensor to achieve reduction in size, and the method of manufacturing such device. The present invention still further achieves the semiconductor photodetecting device with more design flexibility, and the method of manufacturing such device.

Accordingly, the present invention provides a photodetecting device that enables a solid-state image sensor to meet the requirements of higher quality imaging and more reduction in size, and a method of manufacturing such device, which results in the solid-state image sensor with high-performance that is highly suitable for practical use.

As further information about technical background to this application, the disclosure of Japanese Patent Application No. 2004-209676 filed on Jul. 16, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 2 is a diagram showing a RGB primary color array in a color filter;

FIG. 5 is a schematic cross-sectional view showing a structure of a semiconductor photodetecting device according to a second embodiment of the present invention;

DESCRIPTION OF THE PREFERRED EMBODIMENT(S)

The following describes a semiconductor photodetecting device according to the embodiments of the present invention with reference to the drawings.

First Embodiment

Figure 1:
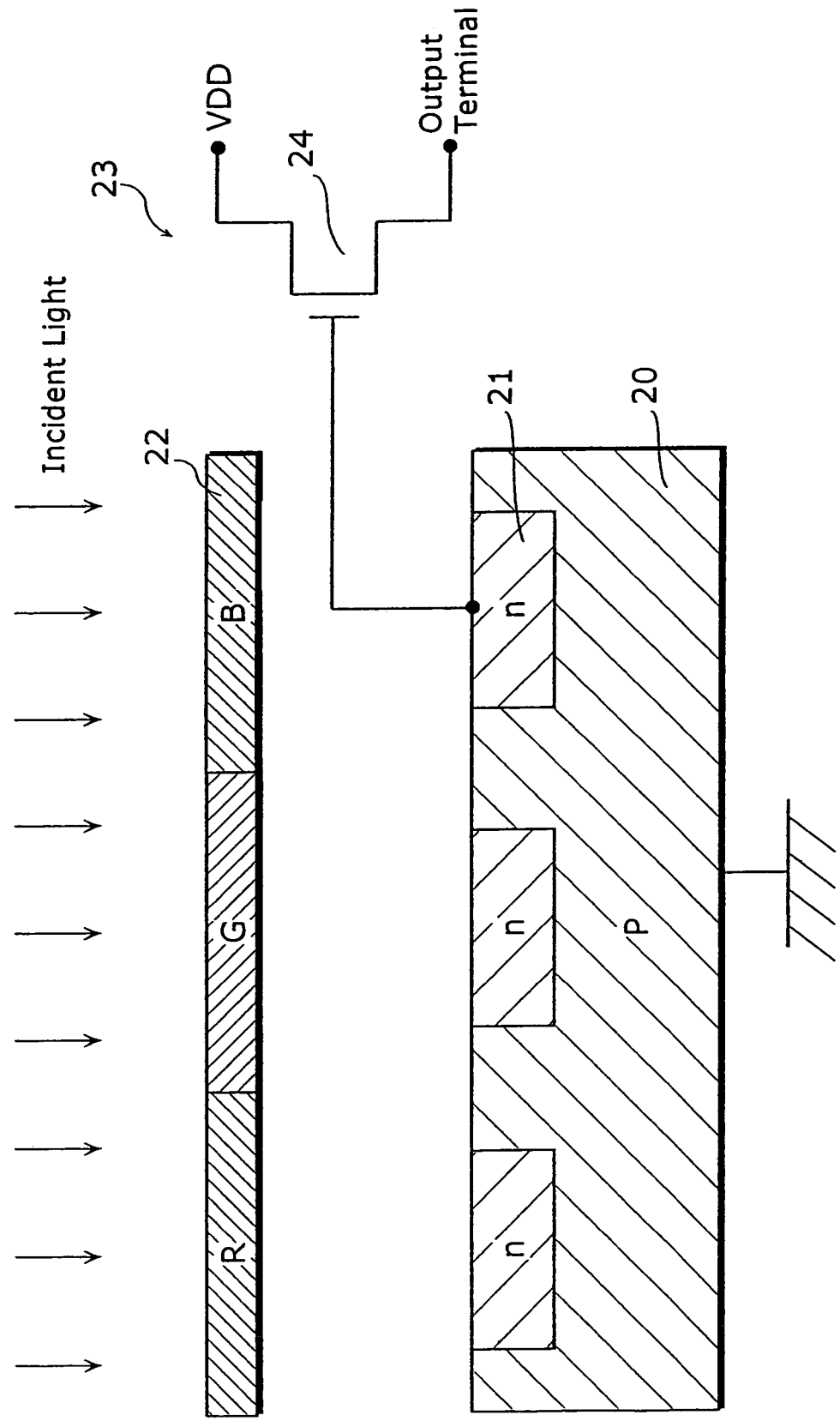
FIG. 1 is a schematic cross-sectional view showing a structure of a semiconductor photodetecting device in a conventional MOS solid-state image sensor and its periphery.
Figure 3:
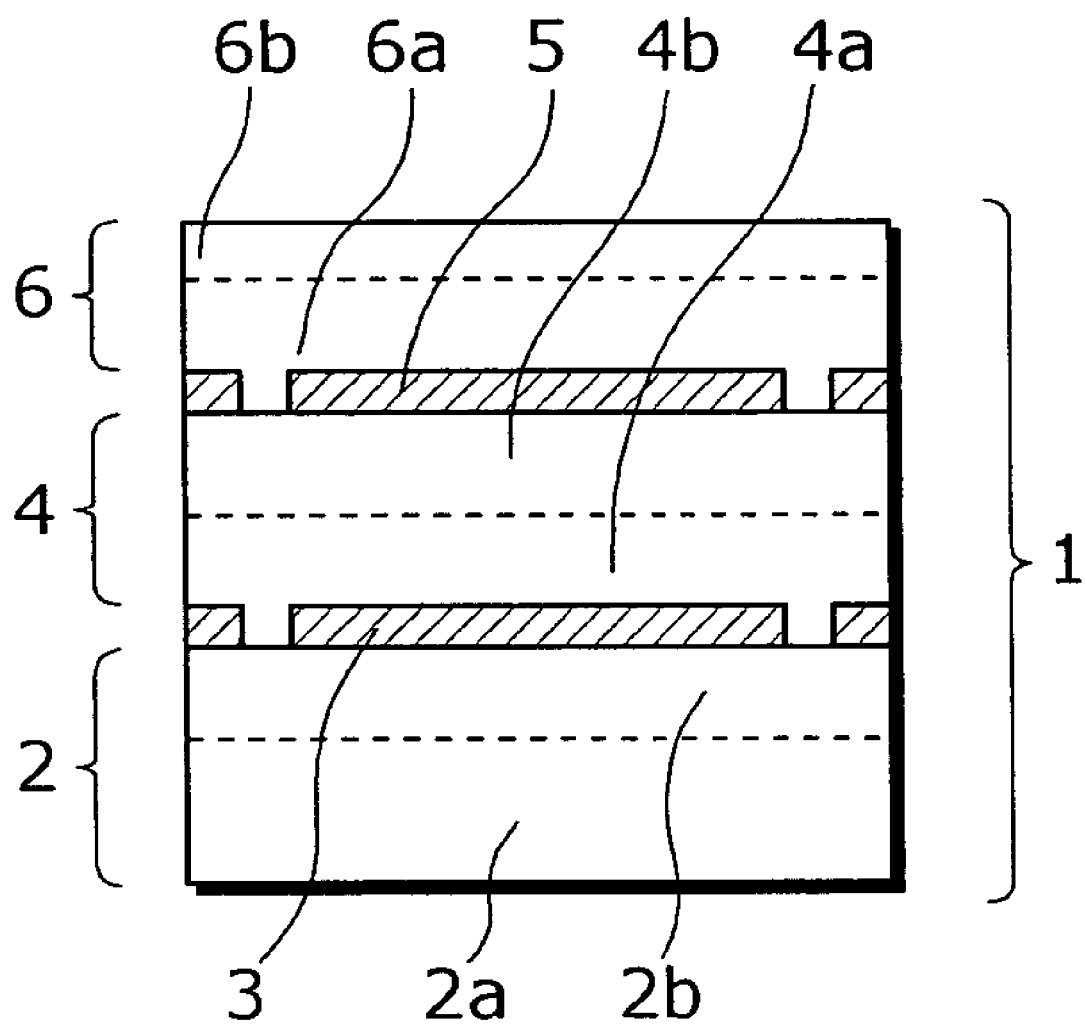
FIG. 3 is a schematic cross-sectional view showing a structure of a semiconductor photodetecting device according to a first embodiment of the present invention.

FIG. 3 is a schematic cross-sectional view showing a structure of a semiconductor photodetecting device according to a first embodiment of the present invention.

The semiconductor photodetecting device is comprised of a semiconductor substrate made of Si or the like (not shown in FIG. 3) and an epitaxial layer 1 formed on the semiconductor substrate by epitaxial growth. The epitaxial layer 1 is formed by sequentially stacking: a first pn junction layer 2; a first insulating layer 3; a second pn junction layer 4; a second insulating layer 5; and a third pn junction layer 6. Light incident on the semiconductor photodetecting device enters the third pn junction layer 6, the second pn junction layer 4 and the first pn junction layer 2 in this order.

The first pn junction 2 is comprised of an n-type layer 2a and a p-type layer 2b, the second pn junction layer 4 is comprised of an n-type layer 4a and a p-type layer 4b, and the third pn junction layer 6 is comprised of an n-type layer 6a and a p-type layer 6b.

The first, second and third pn junction layers 2, 4 and 6 may be made of single crystal Si, or they may have different band gaps. In other words, the first pn junction layer 2 has a smaller band gap than the energy corresponding to the red light wavelength, the second pn junction layer 4 has a larger band gap than the band gap of the first pn junction 2 and smaller than the energy corresponding to the green light wavelength, and the third pn junction layer 6 has a larger band gap than the band gap of the second pn junction layer 4 and smaller than the energy corresponding to the blue light wavelength.

It is desirable to select, as semiconductor materials for the first, second and third pn junction layers 2, 4 and 6, the materials and their compositions that allow the highest sensitivity, from among, for example, Si, amorphous Si, microcrystalline Si, SiC, amorphous SiC and microcrystalline SiC. For example, it is desirable to select, as semiconductor materials, single crystal Si for the first pn junction layer 2, microcrystalline or amorphous Si for the second pn junction layer 4 and single crystal SiC (cubic crystal is desirable) for the third pn junction layer 6.

The first, second and third pn junction layers 2, 4 and 6 have their pn junctions at different positions (depths) therein, and therefore the relative positions between the light incident surface of the semiconductor photodetecting device and the pn junctions in respective pn junction layers are different from each other. In other words, the first pn junction layer 2 has the pn junction at the position which is determined according to the red light absorption depth of the semiconductor material of the first pn junction layer 2, namely, the position at which the first pn junction layer 2 has the highest photodetecting sensitivity to red light. The second pn junction layer 4 has the pn junction at the position which is determined according to the green light absorption depth of the semiconductor material of the second pn junction layer 4, namely, the position at which the second pn junction layer 4 has the highest photodetecting sensitivity to green light. The third pn junction layer 6 has the pn junction at the position which is determined according to the blue light absorption depth of the semiconductor material of the third pn junction layer 6, namely, the position at which the third pn junction layer 6 has the highest photodetecting sensitivity to blue.

In the case where single crystal Si, microcrystalline or amorphous Si, and single crystal SiC are used as semiconductor materials for the first, second and third pn junction layers 2, 4 and 6, the pn junctions of the first, second and third pn junction layers 2, 4 and 6 are formed at depths of 3 μm, 1

µm and 0.4 µm respectively from the light incident surface of the semiconductor photodetecting device.

The first insulating layer 3 electrically isolates the first pn junction layer 2 and the second pn junction layer 4. Openings are formed in the first insulating layer 3, and the first pn junction layer 2 and the second pn junction layer 4 have contact with each other through the openings of the first insulating layer 3 which is placed in between these two pn junction layers.

The second insulating layer 5 electrically isolates the second pn junction layer 4 and the third pn junction layer 6. Openings are formed in the second insulating layer 5, and the second pn junction layer 4 and the third pn junction layer 6 have contact with each other through the openings of the second insulating layer 5 which is placed in between these two pn junction layers.

The first and second insulating layers 3 and 5 are made of, for example, SiN, $SiO_2$, $Al_2O_3$, $TiO_2$, $Ta_2O_5$ or the like. Note that it is desirable to use a transparent material that allows visible light to pass through it in order to avoid loss of light caused by absorption thereof.

In the semiconductor photodetecting device having the above-described structure, the first, second and third pn junction layers 2, 4 and 6 respectively form photodiodes that convert light of different wavelengths into electric charges. For example, the first pn-junction layer 2 forms a red-sensitive photodiode that converts light of a wavelength ranging from 575 nm to 700 nm, which is red light, into electric charges. The second pn-junction layer 4 forms a green-sensitive photodiode that converts light of a wavelength ranging from 490 nm to 575 nm, which is green light, into electric charges. The third pn-junction layer 6 forms a blue-sensitive photodiode that converts light of a wavelength ranging from 400 nm to 490 nm, which is blue light, into electric charges.

A description is given below of a method of manufacturing the semiconductor photodetecting device having the above-described structure, with reference to FIGS. 4A to 4D that are schematic cross-sectional views showing that semiconductor photodetecting device.

Figure 4A:
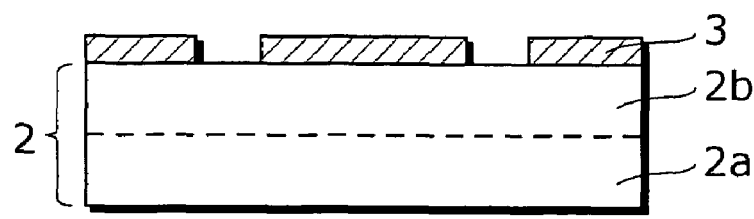
FIG. 4A is a schematic cross-sectional view showing a method of manufacturing the semiconductor photodetecting device according to the first embodiment.

Now, referring to FIG. 4A, the first pn junction layer 2 made of single crystal Si is formed on the Si substrate (not shown in FIG. 4A) by epitaxial growth. Then, the first insulating layer 3 is formed on the first pn junction layer 2 by plasma chemical-vapor deposition (CVD). And then, striped or doughnut-shaped openings are formed in the first insulating layer 3 by lithography and etching such as electron beam exposure.

Figure 4B:
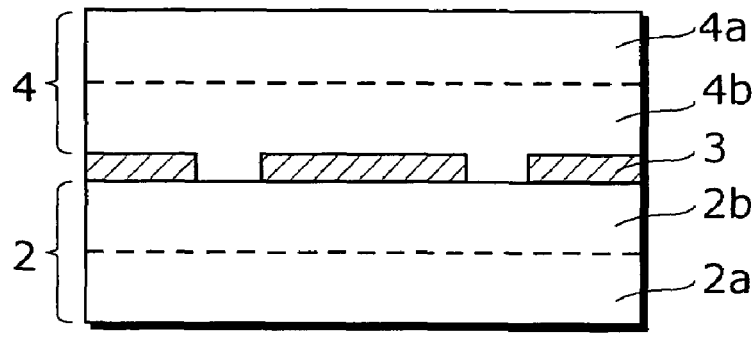
FIG. 4B is a schematic cross-sectional view showing a method of manufacturing the semiconductor photodetecting device according to the first embodiment.

Next, as shown in FIG. 4B, the second pn junction layer 4 made of microcrystalline Si is formed on the first insulating layer 3, by CVD, by regrowing the second pn junction layer 4 on the first pn junction layer 2 through the openings of the first insulating layer 3 which is placed in between these two pn junction layers so that they are adjacent to each other.

Figure 4C:
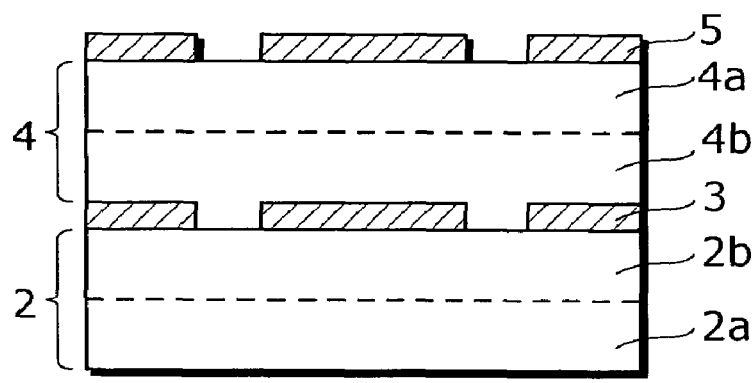
FIG. 4C is a schematic cross-sectional view showing a method of manufacturing the semiconductor photodetecting device according to the first embodiment.

Next, as shown in FIG. 4C, the second insulating layer 5 is formed by plasma CVD. Then, striped or doughnut-shaped openings are formed in the second insulating layer 5 by lithography and etching such as electron beam exposure.

Figure 4D:
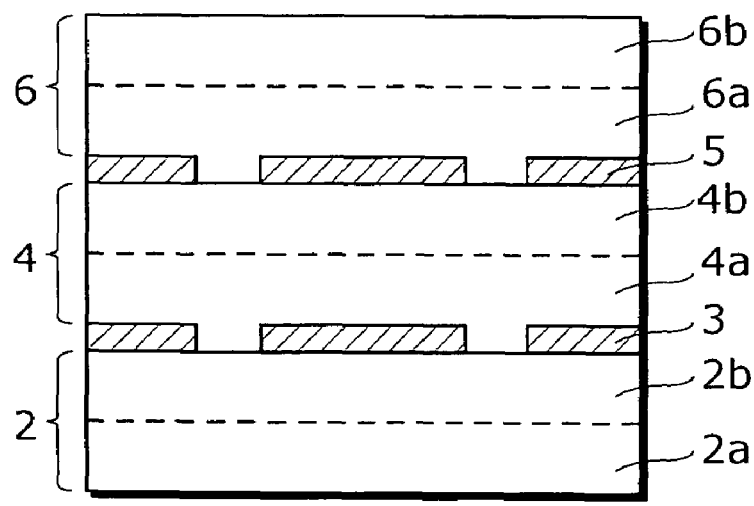
FIG. 4D is a schematic cross-sectional view showing a method of manufacturing the semiconductor photodetecting device according to the first embodiment.

Then, as shown in FIG. 4D, the third pn junction layer 6 made of single crystal Si is formed on the second insulating layer 5, by epitaxial growth, by regrowing the third pn junction layer 6 on the second pn junction layer 4 through the openings of the second insulating layer 5 which is placed in between these two pn junction layers so that they are adjacent to each other.

In the above epitaxial growth or CVD, mono-silane is used as a Si material, while propane is used as a C material.

As described above, in the semiconductor photodetecting device according to the present embodiment, the first pn-junction layer 2 converts red light into electric charges, the second pn-junction layer 4 converts green light into electric charges, and the third pn-junction layer 6 converts blue light into electric charges. Accordingly, all of red, green and blue light components of the incident light can be used in a single semiconductor photodetecting device, which can result in increase in efficiency of available light in the semiconductor photodetecting device and improvement in color reproducibility of images in the solid-state image sensor. Accordingly, the semiconductor photodetecting device according to the present embodiment enables the solid-state image sensor to meet the requirement of still higher quality imaging.

The semiconductor photodetecting device according to the present embodiment can perform RGB primary color sensing in the same location so that it enables the solid-state image sensor to achieve higher resolution of images.

The semiconductor photodetecting device according to the present embodiment enables the solid-state image sensor to do without using a color filter for color separation and without placing on the same plane multiple kinds of semiconductor photodetecting devices for converting red, green, and blue light respectively into electric charges, and therefore enables the solid-state image sensor to meet the requirement of further reduction in size and cost.

Furthermore, in the semiconductor photodetecting device according to the present embodiment, the first, second and third pn junction layers 2, 4 and 6 have different band gaps respectively. Therefore, it becomes possible to design the first pn junction layer 2 so as to have the absorption peak in the red light wavelength region, the second pn junction layer 4 so as to have the absorption peak in the green light wavelength region, and the third pn junction layer 6 so as to have the absorption peak in the blue light wavelength region. As a result, the semiconductor photodetecting device according to the present embodiment enables the solid-state image sensor to improve color reproducibility of images.

For example, in the case where Si, microcrystalline or amorphous Si and single crystal SiC are respectively used as semiconductor materials used for the first, second and third pn junction layers 2, 4 and 6, the wavelengths of the first, second and third pn junction layers 2, 4 and 6 for their highest sensitivities are 750 nm, 550 nm and 450 nm, respectively.

The semiconductor photodetecting device according to the present embodiment is manufactured by epitaxial growth. Therefore, the crystallinity of the semiconductor photodetecting device is improved and thus the sensitivity is also improved, and consequently color reproducibility of images is further improved. Furthermore, the semiconductor photodetecting device according to the present embodiment achieves reduction in chip size and therefore reduction in cost.

As also described above, in the semiconductor photodetecting device according to the present embodiment, the first and second insulating layers 3 and 5 are formed between the first and second pn junction layers 2 and 4 and between the second and third pn junction layers 4 and 6, respectively. Accordingly, an arrangement of p-type regions and n-type regions in a pn junction layer is free of influence from another arrangement in another pn junction layer, which results in high design flexibility in the semiconductor photodetecting device according to the present embodiment. In addition, the semiconductor photodetecting device according to the present embodiment provides complete insulation between pn junction layers and reduces leakage current, so that it enables the solid-state image sensor to meet the requirement of higher quality imaging.

Furthermore, in the semiconductor photodetecting device according to the present embodiment, the second and third pn junction layers 4 and 6 are respectively formed on the first and second insulating layers 3 and 5 by regrowing the second and third pn junction layers 4 and 6 on the first and second pn junction layers 2 and 4 through the openings of the first and second insulating layers 3 and 5 which are placed in between respective two pn junction layers so that the first and second as well as second and third pn junction layers are adjacent to each other. Therefore, the crystallinity of the second and third pn junction layers 4 and 6 becomes poor, and consequently the semiconductor photodetecting device according to the present embodiment achieves higher sensitivity. In addition, the epitaxial growth layers respectively grow in the horizontal direction using, as a seed crystal, a base crystal in the opening of the insulating layer, without any constraints to crystallization or the like of the second and third pn junction layers 4 and 6 by the first and second insulating layer 3 and 5 that are the bases for forming these pn junction layers. Accordingly, the semiconductor photodetecting device according to the present embodiment achieves selection of semiconductor materials for pn junction layers with higher flexibility, namely, it achieves higher design flexibility.

Second Embodiment

FIG. 5 is a schematic cross-sectional view showing a structure of a semiconductor photodetecting device according to a second embodiment of the present invention. Note that the same reference numbers are assigned to the same elements in FIG. 3, and the detailed description thereof is not repeated here.

The semiconductor photodetecting device is comprised of a semiconductor substrate (not shown in FIG. 5) and an epitaxial layer 11 formed on the semiconductor substrate by epitaxial growth or CVD. The epitaxial layer 11 is formed by stacking sequentially: the first pn junction layer 2; a first insulating layer 12 having a refractive index different from the refractive indices of the first pn junction layer 2 and the second pn junction layer 4; the second pn junction layer 4; a second insulating layer 13 having a refractive index different from the refractive indices of the second pn junction layer 4 and the third pn junction layer 6; the third pn junction layer 6; and a third insulating layer 14 having a refractive index different from the refractive index of the third pn junction layer 6.

Figure 6A:
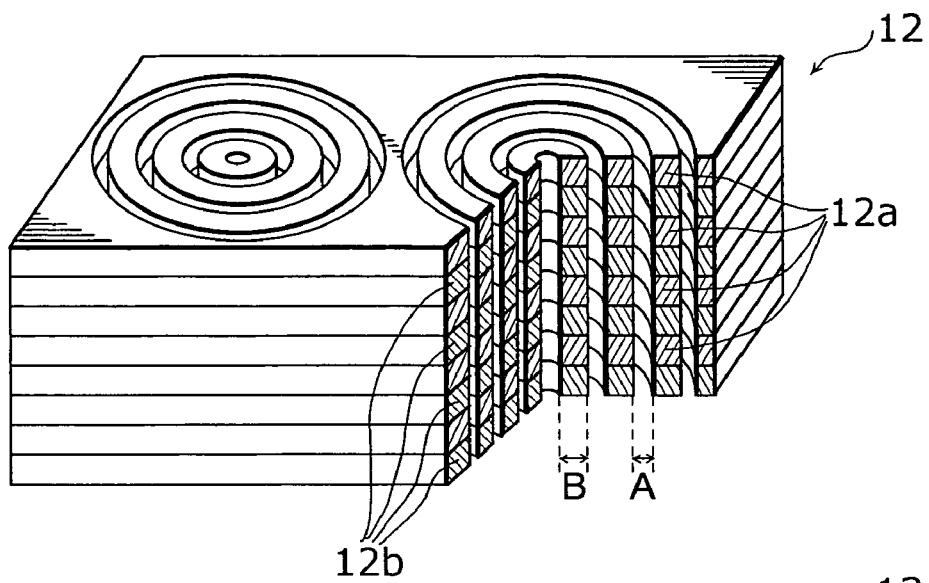
FIG. 6A is an external view of a first insulating layer.
Figure 6B:
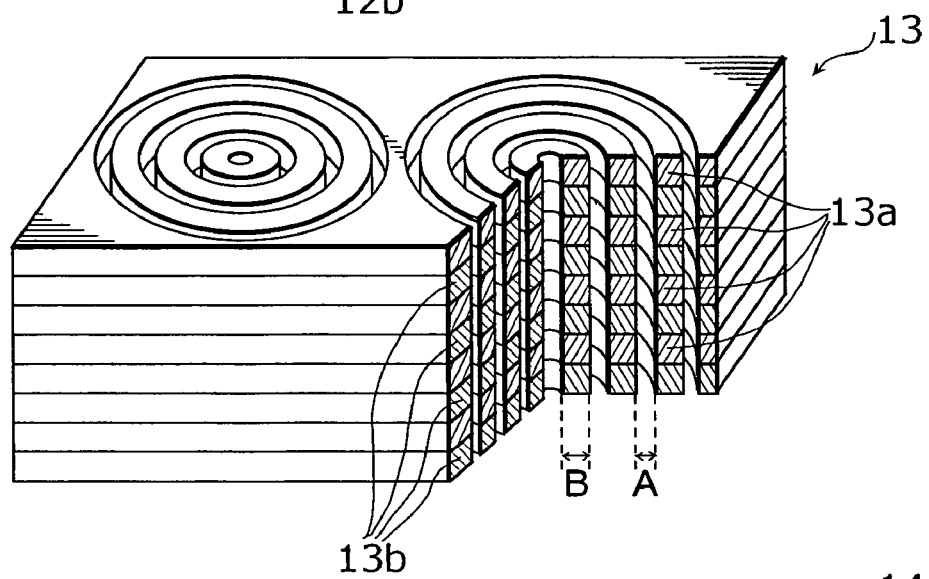
FIG. 6B is an external view of a second insulating layer.
Figure 6C:
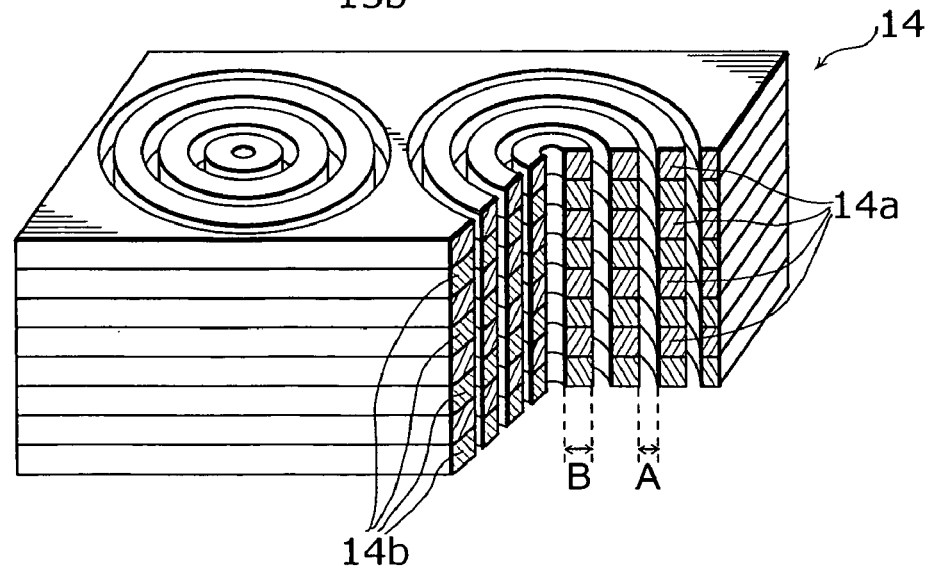
FIG. 6C is an external view of a third insulating layer.

FIG. 6A is an external view of the first insulating layer 12, FIG. 6B is an external view of the second insulating layer 13, and FIG. 6C is an external view of the third insulating layer 14.

The first insulating layer 12 has a multilayer structure, and electrically isolates the first pn junction layer 2 and the second pn junction layer 4. The first insulating layer 12 has a periodic structure of refractive indices in the stacking direction. To be more specific, the first insulating layer 12 includes low refractive layers 12a made of low refractive material as the odd-numbered layers including the top layer as well as high refractive layers 12b made of high refractive material as the even-numbered layers including the second layer from the top, and these layers 12a and 12b are stacked alternately. On the other hand, the first insulating layer 12 has a periodic structure of similar-shaped circles which are concentric in the in-plane direction. To be more specific, a central opening and its surrounding doughnut-shaped openings on the top layer respectively penetrate the first insulating layer 12 vertically down to the bottom layer. The widths of these openings (A in FIG. 6A) are the same, and the spacing (pitch) between adjacent two openings (B in FIG. 6B) becomes smaller as the opening is farther from the center of the circles.

The second insulating layer 13 has a multilayer structure, and electrically isolates the second pn junction layer 4 and the third pn junction layer 6. The second insulating layer 13 has a periodic structure of refractive indices in the stacking direction. To be more specific, the second insulating layer 13 includes low refractive layers 13a made of low refractive material as the odd-numbered layers including the top layer as well as high refractive layers 13b made of high refractive material as the even-numbered layers including the second layer from the top, and these layers 13a and 13b are stacked alternately. On the other hand, the second insulating layer 13 has a periodic structure of similar-shaped circles which are concentric in the in-plane direction, in the same manner as the first insulating layer 12.

The third insulating layer 14 has a multilayer structure, and has a periodic structure of refractive indices in the stacking direction. To be more specific, the third insulating layer 14 includes low refractive layers 14a made of low refractive material as the odd-numbered layers including the top layer as well as high refractive layers 14b made of high refractive material as the even-numbered layers including the second layer from the top, and these layers 14a and 14b are stacked alternately. On the other hand, the second insulating layer 14 has a periodic structure of similar-shaped circles which are concentric in the in-plane direction, in the same manner as the first insulating layer 12.

As materials for the low refractive layers 12a, 13a and 14a, $SiO_2$ or the like can be used, for example, and as materials for the high refractive layers 12b, 13b and 14b, $TiO_2$, $Ta_2O_5$ or the like can be used, for example. Note that it is desirable that these materials are transparent and allows visible light to pass through it in order to avoid absorption loss. When $SiO_2$ is used for the low refractive layers 12a, 13a and 14a and $TiO_2$ is used for the high refractive layers 12b, 13b and 14b, the $SiO_2$ film thicknesses of the low refractive layers 12a, 13a and 14a are 94 nm, 77 nm and 60 nm respectively, whereas the $TiO_2$ film thicknesses of the high refractive layers 12b, 13b and 14b are 55 nm, 45 nm and 35 nm respectively. The low and high refractive layers have the above-mentioned film thicknesses, so that the first insulating layer 12 has a high reflectivity to the light with wavelength of 550 nm, the second insulating layer 13 has a high reflectivity to the light with wavelength of 450 nm, and the third insulating layer 14 has a high reflectivity for the light with wavelength of 350. In other words, this structure allows higher photosensitivity at the first, second and third pn junction layers. This structure with concentric openings is a periodic structure, namely so-called photonic crystal structure. A combination of this horizontal periodic structure of concentric openings and the above-mentioned vertical periodic structure of refractive indices achieves RGB color separation and light condensing. It is desirable that the width of the opening of the first insulating layer 12 is 180 nm, that of the second insulating layer 13 is 150 nm, and that of the third insulating layer 14 is 120 nm.

A description is given below of a method of manufacturing the semiconductor photodetecting device according to the present embodiment, with reference to the schematic cross-sectional views of the semiconductor photodetecting device shown in FIGS. 7A, 7B, 7C and 7D. Note that the same reference numbers are assigned to the same elements in FIG. 3, and the detailed description thereof is not repeated here.

Figure 7A:
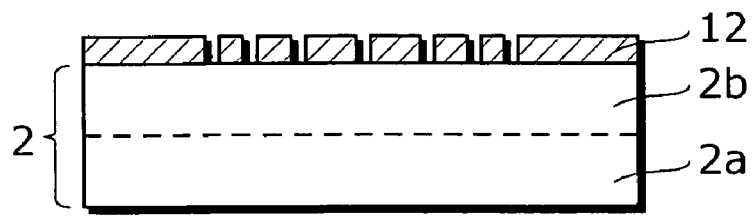
FIG. 7A is a schematic cross-sectional view showing a method of manufacturing the semiconductor photodetecting device according to the second embodiment.

First, as shown in FIG. 7A, the first pn junction layer 2 made of single crystal Si is formed on the silicon substrate (not shown in FIG. 7A) by epitaxial growth. Then, the first insulating layer 12 is formed by alternately forming the low refractive layers 12a made of $SiO_2$ and the high refractive layers 12b made of $TiO_2$ on the first pn junction layer 2 by plasma CVD. Then, similar-shaped cavities which are concentric in the in-plane direction are formed in the first insulating layer 12 by lithography and etching such as electron beam exposure, so that the first insulating layer 12 has the openings.

Figure 7B:
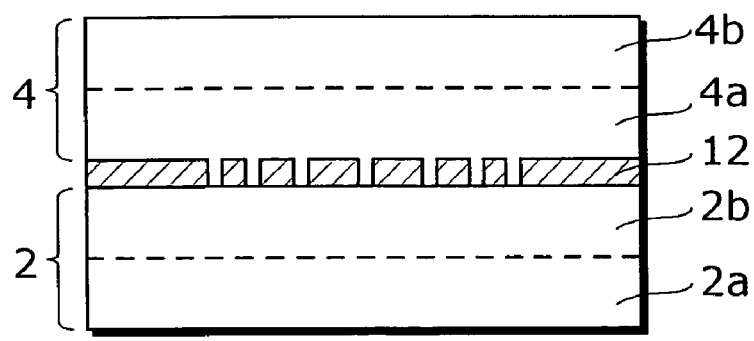
FIG. 7B is a schematic cross-sectional view showing a method of manufacturing the semiconductor photodetecting device according to the second embodiment.

Next, as shown in FIG. 7B, the second pn junction layer 4 made of microcrystalline Si is formed, by CVD or plasma CVD, on the first insulating layer 12 by regrowing the second pn junction layer 4 on the first pn junction layer 2 through the openings of the first insulating layer 12 which is placed in between these two pn junction layers so that they are adjacent to each other.

Figure 7C:
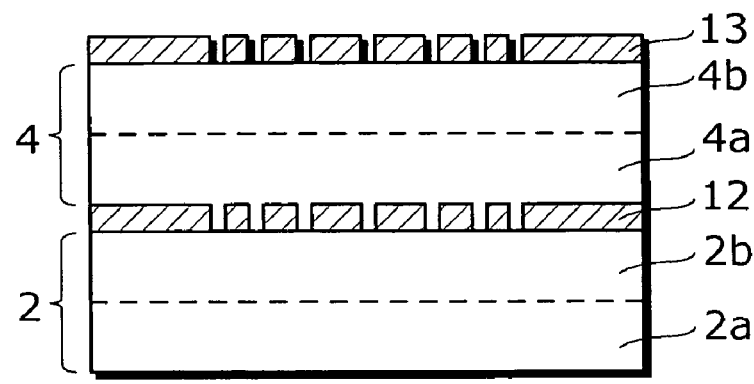
FIG. 7C is a schematic cross-sectional view showing a method of manufacturing the semiconductor photodetecting device according to the second embodiment.

Next, as shown in FIG. 7C, the second insulating layer 13 is formed by alternately forming the low refractive layers 13a made of $SiO_2$ and the high refractive layers 13b made of $TiO_2$ on the second pn junction layer 4 by plasma CVD. Then, similar-shaped cavities which are concentric in the in-plane direction are formed in the second insulating layer 13 by lithography and etching such as electron beam exposure by lithography and etching such as electron beam exposure so that the second insulating layer 13 has the openings.

Figure 7D:
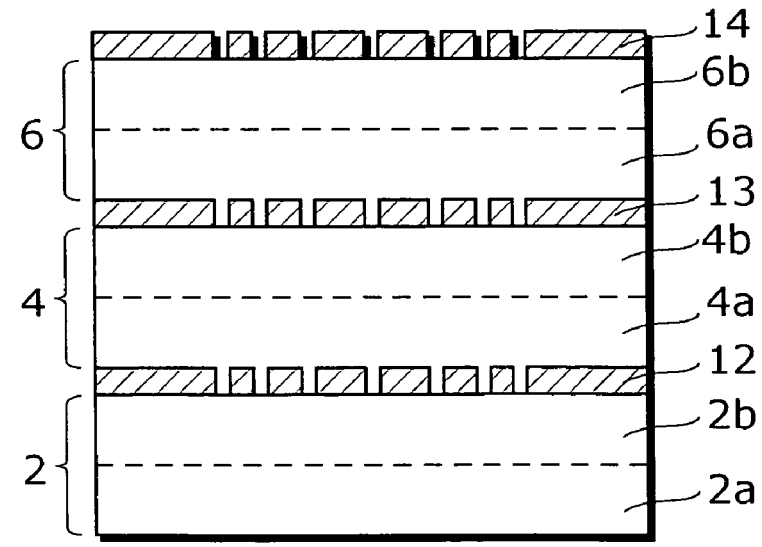
FIG. 7D is a schematic cross-sectional view showing a method of manufacturing the semiconductor photodetecting device according to the second embodiment.

Next, as shown in FIG. 7D, the third pn junction layer 6 made of single crystal SiC (cubic crystal is desirable)) is formed, by epitaxial growth, on the second insulating layer 13 by regrowing the third pn junction layer 6 on the second pn junction layer 4 through the openings of the second insulating layer 13 which is placed in between these two pn junction layers so that they are adjacent to each other. Then, the third insulating layer 14 is formed by alternately forming the low refractive layers 14a made of $SiO_2$ and the high refractive layers 14b made of $TiO_2$ on the third pn junction layer 6 by plasma CVD. Then, similar-shaped cavities which are concentric in the in-plane direction are formed in the third insulating layer 14 by lithography and etching such as electron beam exposure, so that the third insulating layer 14 has the openings.

As described above, the semiconductor photodetecting device according to the present embodiment improves color reproducibility of images in the solid-state image sensor, and therefore enables the solid-state image sensor to meet the requirement of still higher quality imaging. The semiconductor photodetecting device according to the present embodiment also enables the solid-state image sensor to achieve higher resolution of images. Furthermore, the semiconductor photodetecting device according to the present embodiment enables the solid-state image sensor to meet the requirement of further reduction in size and cost.

The semiconductor photodetecting device according to the present embodiment is comprised of the first, second and third insulating layers 12, 13 and 14 having the periodic structure of refractive indices in the stacking direction. The transmission wavelengths of these insulating layers are respectively determined by the thicknesses and the refractive indices of their low refractive layers 12a, 13a and 14a and high refractive layers 12b, 13b and 14b. Therefore, the first, second and third insulating layers 12, 13 and 14 function as so-called filters with higher refractive indices for particular light. Accordingly, the semiconductor photodetecting device according to the present embodiment guides, with nearly no loss, red light, green light and blue light into the first pn junction layer 2, the second pn junction layer 4 and the third pn junction layer 6, respectively, so that it can achieve more improvement of color reproducibility of images in the solid-state image sensor.

In addition, the semiconductor photodetecting device according to the present embodiment is comprised of the first, second and third insulating layers 12, 13 and 14 having the periodic structure of similar shapes which are concentric in the in-place direction, namely a so-called photonic crystal structure. Therefore, the first, second and third insulating layers 12, 13 and 14 have a so-called digital microlens function for condensing incident light in the pn junction layer. Accordingly, this structure enables monolithic integration of a photodetecting device and a light condensing device.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

For example, in the above embodiments, the first, second and third insulating layers are formed respectively between the first and second pn junction layers, between the second and third pn junction layers, and on the third pn junction layer. However, low resistance layers may be formed between the first and second pn junction layers, between the second and third pn junction layers, and on the third pn junction layer, unless the first, second and third pn junction layers as photodetecting devices do not lose their functions.

INDUSTRIAL APPLICABILITY

The present invention can be utilized for a semiconductor photodetecting device, and more particularly for a semiconductor photodetecting device or the like in a CCD or CMOS type solid-state image sensor.

What is claimed is:

1. A semiconductor photodetecting device which converts incident light into electric charges, said device comprising:
   stacked pn junction layers; and
   a pn junction isolating layer formed between said pn junction layers which are adjacent to each other,
   wherein said pn junction isolating layer has openings,
   wherein said pn junction layers are adjacent to each other through the openings,
   wherein said pn junction isolating layer is made of a material having a refractive index different from refractive indices of the adjacent layers, and has a light condensing function,
   wherein the openings of said pn junction isolating layer are concentric on a plane of said pn junction isolating layer, and said pn junction isolating layer is formed so that light that passes through said pn junction isolating layer is brought into focus at a pn junction in said pn junction layer placed below said pn junction isolating layer, and
   wherein the openings of said pn junction isolating layer include a central opening and a plurality of doughnut-shaped openings surrounding the central opening.

2. The semiconductor photodetecting device according to claim 1,
   wherein said pn junction isolating layer includes an insulating layer.

3. The semiconductor photodetecting device according to claim 2, wherein said pn junction layers comprise:
   a first pn junction layer;
   a second pn junction layer placed above said first pn junction layer; and a third pn junction layer placed above said second pn junction layer, wherein a band gap of said first pn junction layer is smaller than a band gap of said second pn junction layer, and the band gap of said second pn junction layer is smaller than a band gap of said third pn junction layer.

4. The semiconductor photodetecting device according to claim 3, wherein the band gap of said first pn junction layer is smaller than energy corresponding to a red light wavelength, the band gap of said second pn junction layer is smaller than energy corresponding to a green light wavelength, and the band gap of said third pn junction layer is smaller than energy corresponding to a blue light wavelength.

5. The semiconductor photodetecting device according to claim 4, wherein a pn junction in said first pn junction layer is positioned to have highest photodetecting sensitivity to red light, a pn junction in said second pn junction layer is positioned to have highest photodetecting sensitivity to green light, and a pn junction in said third pn junction layer is positioned to have highest photodetecting sensitivity to blue light.

6. The semiconductor photodetecting device according to claim 5, wherein said pn junction isolating layer is made of a material including oxygen.

7. The semiconductor photodetecting device according to claim 1, wherein said pn junction isolating layer selectively allows light having a predetermined wavelength to pass through said pn junction isolating layer.

8. The semiconductor photodetecting device according to claim 7, wherein said pn junction isolating layer is made up of at least two stacked layers having different refractive indices.

9. The semiconductor photodetecting device according to claim 1, wherein each of said pn junction layers is made of a semiconductor material including silicon.

10. The semiconductor photodetecting device according to claim 9, wherein at least one of said pn junction layers is made of one of the following: amorphous silicon, microcrystalline silicon, single crystal silicon carbide, amorphous silicon carbide and microcrystalline silicon carbide.

11. The semiconductor photodetecting device according to claim 1, wherein said pn junction isolating layer is made of one of silicon dioxide and silicon nitride.

* * * * *